United States Patent
Schnepper

(10) Patent No.: US 7,529,951 B2
(45) Date of Patent: May 5, 2009

(54) MEMORY SUBSYSTEM VOLTAGE CONTROL AND METHOD THAT REPROGRAMS A PREFERRED OPERATING VOLTAGE

(75) Inventor: Randy L. Schnepper, Rosemount, MN (US)

(73) Assignee: Micron Technology, Inc., Boise, ID (US)

( * ) Notice: Subject to any disclaimer, the term of this patent is extended or adjusted under 35 U.S.C. 154(b) by 409 days.

(21) Appl. No.: 11/350,961

(22) Filed: Feb. 8, 2006

(65) Prior Publication Data

US 2006/0129853 A1 Jun. 15, 2006

Related U.S. Application Data

(62) Division of application No. 10/378,692, filed on Mar. 4, 2003, now Pat. No. 7,127,622.

(51) Int. Cl.
*G06F 1/26* (2006.01)

(52) U.S. Cl. .................................. 713/300; 711/105

(58) Field of Classification Search ................ 713/300; 711/105

See application file for complete search history.

(56) References Cited

U.S. PATENT DOCUMENTS

| | | | |
|---|---|---|---|
| 4,545,010 A | 10/1985 | Salas et al. |
| 4,654,787 A | 3/1987 | Finnell et al. |
| 5,097,437 A | 3/1992 | Larson |
| 5,237,674 A | 8/1993 | Mohme et al. |
| 5,253,357 A | 10/1993 | Allen et al. |
| 5,375,084 A | 12/1994 | Begun et al. |
| 5,418,924 A | 5/1995 | Dresser |
| 5,430,859 A | 7/1995 | Norman et al. |
| 5,509,138 A | 4/1996 | Cash et al. |
| 5,621,685 A | 4/1997 | Cernea et al. |
| 5,684,973 A | 11/1997 | Sullivan et al. |
| 5,727,182 A | 3/1998 | Fukushima et al. |
| 5,727,208 A | 3/1998 | Brown |
| 5,757,712 A | 5/1998 | Nagel et al. |
| 5,847,552 A | 12/1998 | Brown |
| 5,953,243 A | 9/1999 | Capps, Jr. et al. |
| 5,960,462 A | 9/1999 | Solomon et al. |
| 6,067,593 A | 5/2000 | Schade |
| 6,092,146 A | 7/2000 | Dell et al. |
| 6,170,059 B1 | 1/2001 | Pruett et al. |
| 6,185,629 B1 | 2/2001 | Simpson et al. |
| 6,226,729 B1 | 5/2001 | Stevens et al. |
| 6,256,217 B1 | 7/2001 | Rondeau et al. |
| 6,298,426 B1 | 10/2001 | Ajanovic |
| 6,317,812 B1 | 11/2001 | Lofgren et al. |
| 6,351,827 B1 | 2/2002 | Co et al. |
| 6,362,996 B2 | 3/2002 | Chang |
| 6,363,450 B1 | 3/2002 | Lash et al. |

(Continued)

*Primary Examiner*—Thomas Lee
*Assistant Examiner*—Albert Wang
(74) *Attorney, Agent, or Firm*—TraskBritt

(57) ABSTRACT

A method and apparatus for providing a preferred operating voltage to a memory device as specified by a stored configuration parameter. The apparatus includes a nonvolatile memory configured to store a preferred memory device voltage configuration corresponding to a preferred operating voltage of the memory device. The preferred memory device voltage configuration is readable by a host and the circuit is responsive to a command to modify the voltage to the memory device in accordance with the preferred memory device configuration. The voltage to the memory device is modified for improved performance and compatibility of the memory device with a host system.

5 Claims, 5 Drawing Sheets

U.S. PATENT DOCUMENTS

| | | |
|---|---|---|
| 6,407,946 B2 | 6/2002 | Maruyama et al. |
| 6,434,034 B1 | 8/2002 | Wallace et al. |
| 6,473,831 B1 | 10/2002 | Schade |
| 6,510,099 B1 | 1/2003 | Wilcox et al. |
| 6,516,381 B1 | 2/2003 | Hamilton et al. |
| 6,769,069 B1 | 7/2004 | Nguyen |
| 6,845,444 B2 | 1/2005 | Su et al. |
| 6,904,506 B2 | 6/2005 | Wu et al. |
| 7,035,159 B2 * | 4/2006 | Janzen et al. ............ 365/225.7 |
| 7,103,718 B2 * | 9/2006 | Nickel et al. ................ 711/115 |
| 7,327,612 B2 * | 2/2008 | Bacchus et al. ....... 365/189.011 |
| 2002/0145919 A1 | 10/2002 | Lamb et al. |
| 2002/0184579 A1 | 12/2002 | Alvarez, II et al. |
| 2004/0039745 A1 | 2/2004 | Evans et al. |
| 2004/0089717 A1 | 5/2004 | Harari et al. |
| 2004/0158771 A1 | 8/2004 | Garnett et al. |
| 2004/0243753 A1 | 12/2004 | Horowitz et al. |

* cited by examiner

MEMORY SUBSYSTEM VOLTAGE CONTROL AND METHOD THAT REPROGRAMS A PREFERRED OPERATING VOLTAGE

CROSS-REFERENCE TO RELATED APPLICATION

This application is a divisional of application Ser. No. 10/378,692, filed Mar. 4, 2003, now U.S. Pat. No. 7,127,622, issued Oct. 24, 2006.

BACKGROUND OF THE INVENTION

1. Field of the Invention

The present invention relates to computer system memories and, more particularly, to controlling operating voltage provided to memory devices.

2. State of the Art

Computer systems are typically designed to accommodate memory devices that perform within a specific band of operational parameters. For example, a computer design may accommodate specific memory devices that perform reading and writing operations at a defined speed or rate. Such an interdependent design philosophy disregards many realities of the environment of a computer system over its lifetime. For example, designing for a specific performance relationship between a microprocessor and memory devices does not allow for the independent improvements to each of the components that may, and generally does, occur. For example, microprocessor speeds may outpace memory device performance, or vice versa. In an attempt to decouple such a relationship, memory controllers have been designed to provide data brokering between the microprocessor and the memory device. Once memory controllers became ubiquitous in computer system designs, broad variations in memory device performance parameters have become commonplace.

Additionally, memory devices are generally tested and graded during manufacturing, with similarly performing devices integrated together into independent memory modules. As technology advances or as a computer system's memory needs change, memory modules may be upgraded or exchanged within a computer system. When memory modules are added, replaced, or exchanged with other memory modules, the memory controller adapts the timing between the memory modules and the microprocessor.

To date, the adaptation between the memory modules and the memory controller has been limited to modifications in timing and control parameters. However, it is known that memory technology improvements have also been made which have resulted in changes to improved or optimal operational voltages of the memory devices. Memory devices operating at a modified voltage level may exhibit an improvement in performance. Adaptation of such parameters has not been addressed by the prior art.

BRIEF SUMMARY OF THE INVENTION

The present invention comprises a method and circuit for configuring a memory device operating voltage in a system in accordance with a preferred memory device voltage configuration stored in conjunction with the deployment of the memory device. A preferred operating voltage for one or more memory devices is determined and stored as a preferred memory device voltage configuration in nonvolatile storage associated with the memory device. In one embodiment, the memory device and the nonvolatile memory having the preferred voltage configuration stored therein co-reside on a memory module. When the memory module is hosted by a computer system, the preferred memory device voltage configuration is read and commands generated for modifying the voltage are supplied to the memory device.

The present invention also comprises an electronic system and computer system embodiments incorporating the circuitry and method. In the system embodiments, a processor coupled to a memory module including one or more memory devices and the nonvolatile memory reads the preferred memory device voltage configuration and generates commands to bias the memory device voltage.

The present invention further includes a method for testing the operation range of a memory device using a reprogrammable nonvolatile memory device configured in accordance with an embodiment of the present invention.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
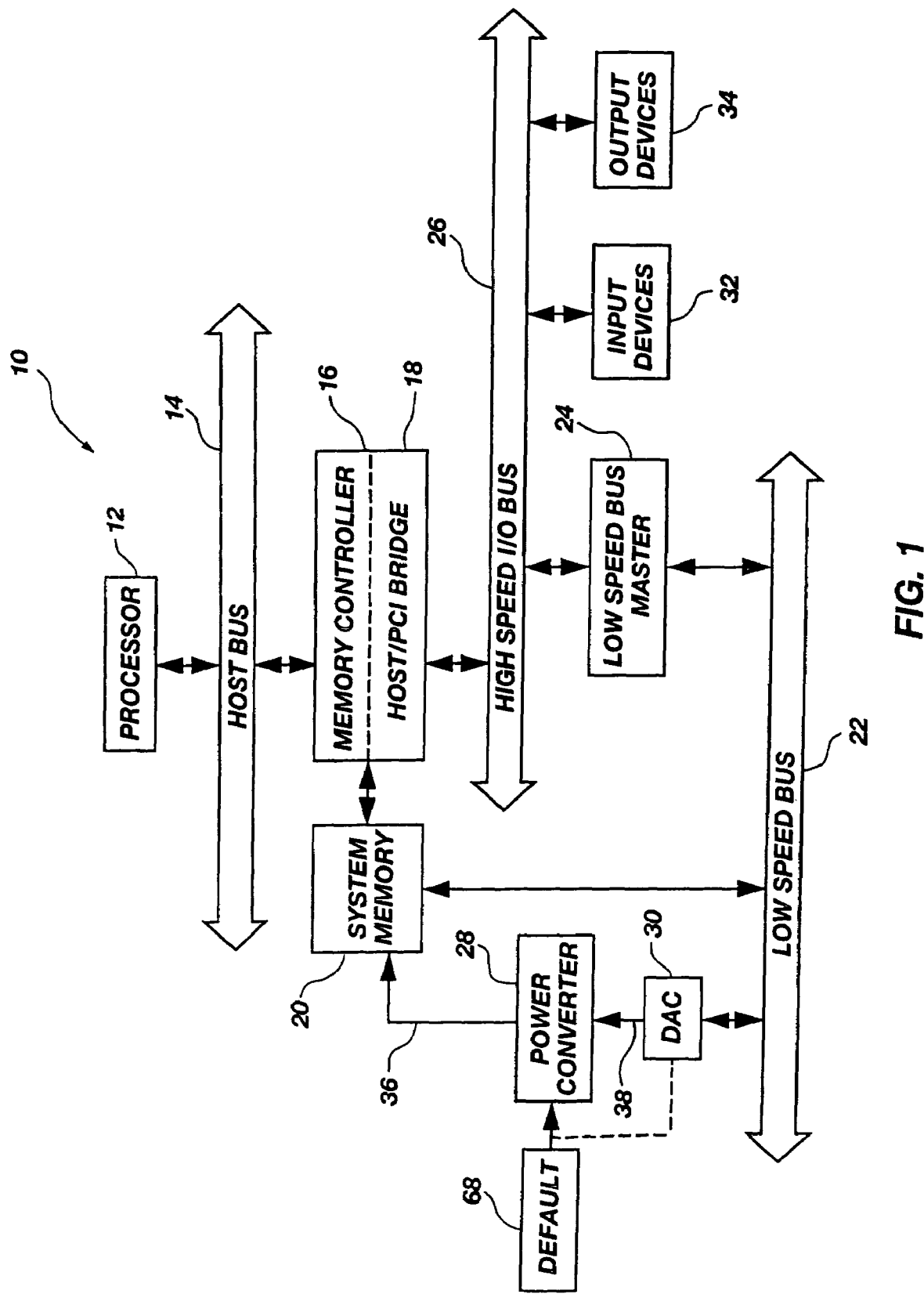
FIG. 1 is a system block diagram of a computer system, in accordance with an embodiment of the present invention.

FIG. 1 illustrates a block diagram of a computer configured in accordance with an embodiment of the present invention. The computer 10 includes a processor 12 which is further connected to a high speed host bus 14 configured in a manner appreciated by those of ordinary skill in the art. Host bus 14 further couples to one or more logic devices (e.g., a system core logic chip set), a portion of which is illustrated as memory controller 16 and bus bridge 18. Memory controller 16 and bus bridge 18 may be from a chip set, such as a Triton VX chip by Intel Corporation of Santa Clara, Calif. Memory controller 16 includes memory mapping logic for mapping processor 12 addresses to a particular address base in system memory 20.

System memory 20 comprises a random access memory (RAM) resident on one or more memory modules such as a dual in-line memory module (DIMM), single in-line memory module (SIMM), RAMBUS® in-line memory module (RIMM) and Triple in-line memory module (TRIMM) as well as others. In an exemplary embodiment, the memory module or modules, detailed below in FIG. 2, each further include an electronically readable nonvolatile memory which identifies a particular preferred voltage configuration corresponding to a preferred operating voltage, for example $V_{DD}$, $V_{DDQ}$ and/or $V_{ref}$, of at least one memory device on the corresponding memory module.

System memory 20 is further connected to a low speed bus 22 which may be implemented as a serial bus such as a System Management (SM) bus or an $I^2C$ bus. In the exemplary embodiment, the nonvolatile memory of system memory 20 is accessed using the low speed bus 22. Low speed bus 22 is managed by a low speed bus master 24 which interfaces with processor 12 via a high speed I/O bus 26, an example of which is a PCI bus. The low speed bus master 24 may be implemented as an SM bus controller which forms a portion of, for example, a PIIX4 chip by Intel Corporation.

Computer 10, in accordance with an embodiment of the present invention, further includes a power converter 28 which provides an adjustable power, in the form of voltage and current, to system memory 20. Power converter 28 generates memory operating voltage 36 for operation of system memory 20. In an exemplary embodiment, power converter 28 operates initially under a default voltage configuration, illustrated in FIG. 1 as default voltage configuration 68. While the configuration and operation of power converter 28 may be altered according to various circuits, a preferred implementation couples a voltage bias to modify or set the memory operating voltage 36 to preferred operating voltage.

Figure 3:
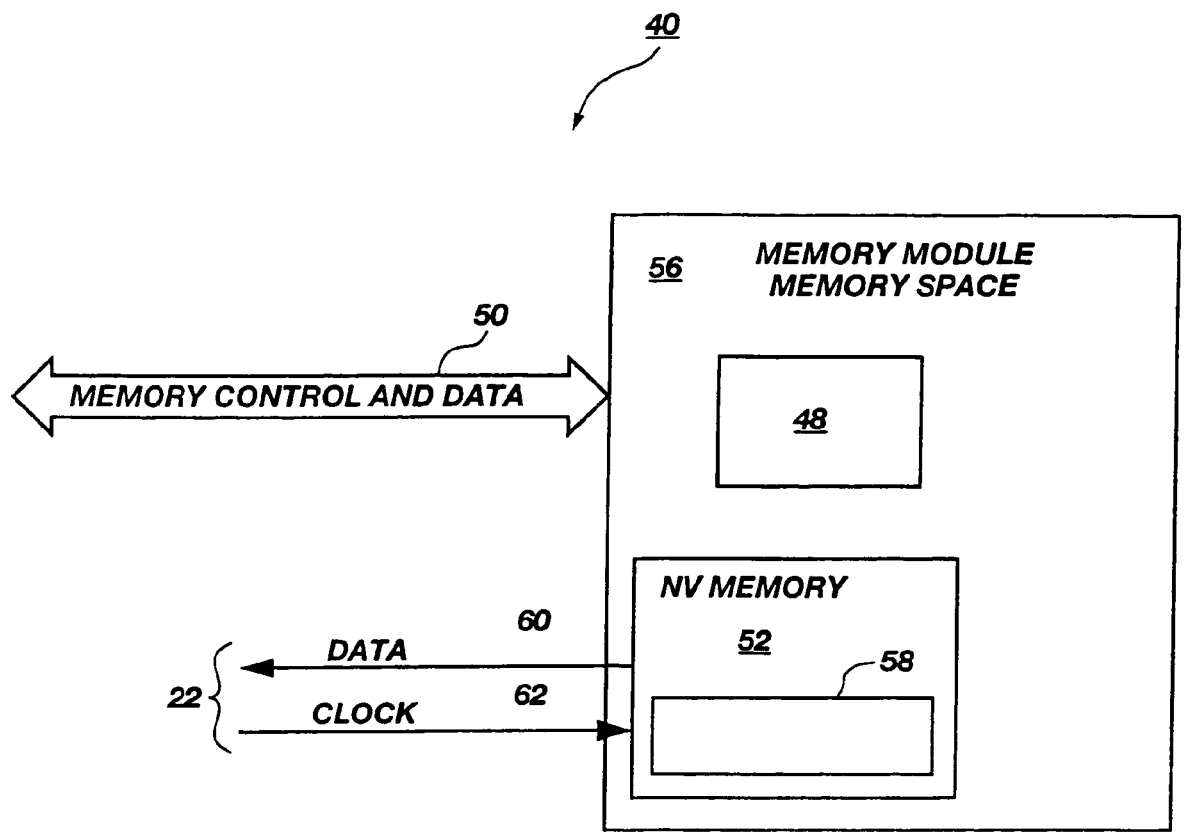
FIG. 3 is a block diagram of a memory module configured in accordance with an embodiment of the present invention.

In a preferred embodiment, a power converter bias 38 is generated, in part, by processor 12 reading a preferred memory device voltage configuration 58 (FIG. 3) via the low speed bus 22. Processor 12 generates a digital command and sends the command via the low speed bus 22 to a digital-to-analog converter (DAC) 30 which, in turn, generates a power converter bias 38 to cause the power converter 28 to modify memory operating voltage 36 to a preferred operating voltage, as specified by the preferred memory device voltage configuration 58 (FIG. 3). As illustrated, low speed bus 22 is coupled to the high speed I/O bus 26 via a low speed bus master 24 or controller as used for the support of low speed peripherals, such as for the accessing of the nonvolatile memory within system memory 20 as well as for the interaction with the DAC 30, which provides a power converter bias 38 to power converter 28.

Computer 10 further includes input devices 32 which may couple directly or indirectly with the high speed I/O bus 26, in one or more various configurations known to those of ordinary skill in the art. Similarly, output devices 34 also couple to high speed I/O bus 26 in either a direct or indirect manner, also known to those of ordinary skill in the art.

Figure 2:
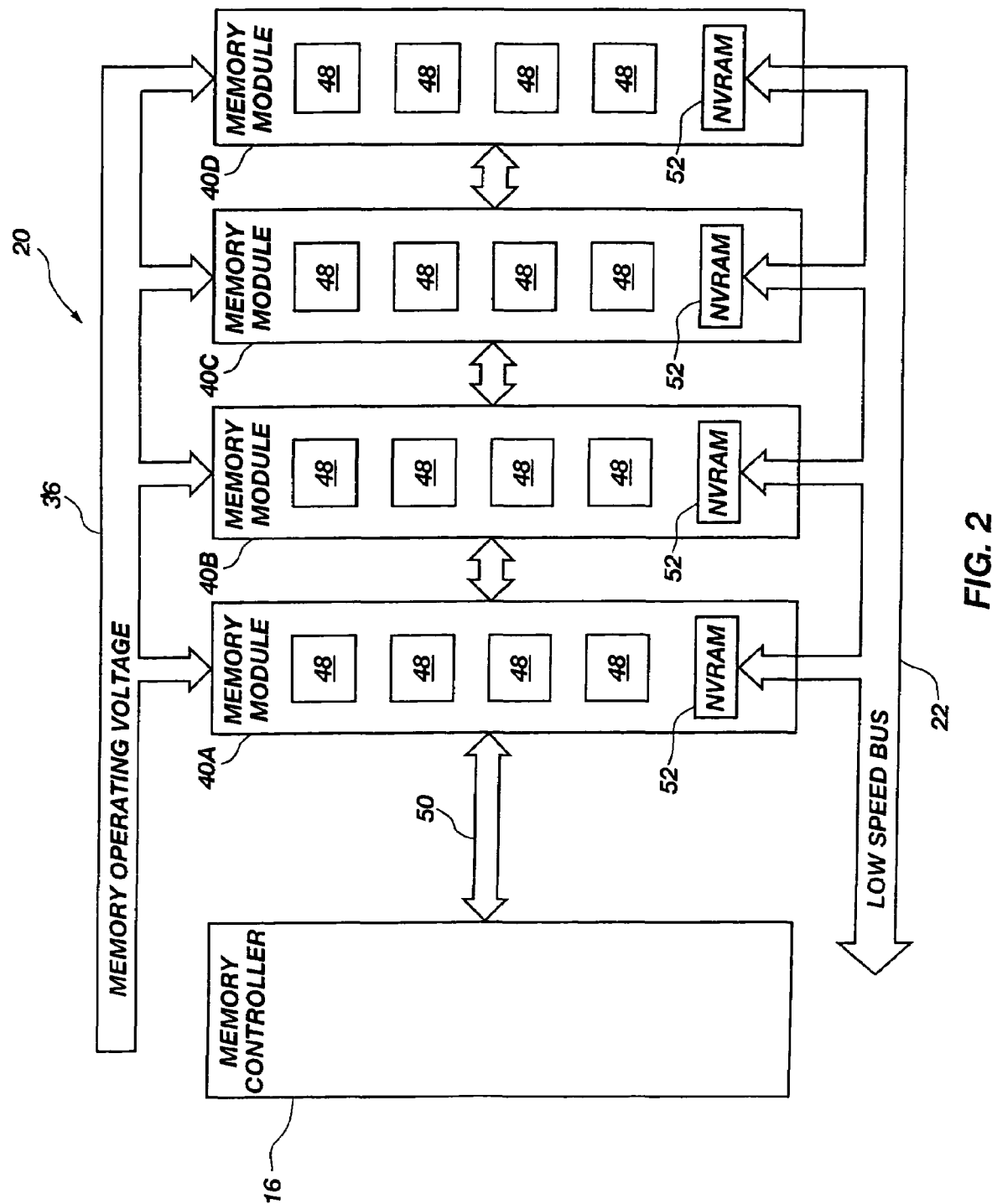
FIG. 2 is a block diagram of a memory system according to an embodiment of the present invention.

FIG. 2 is a block diagram of the system memory 20, in accordance with an exemplary embodiment of the present invention. System memory 20 may have multiple and different organizations including multiple sockets for receiving multiple memory modules. The system memory 20 may also be configured to include a variety of memory module types and may further include discrete chips directly mounted on a motherboard. The memory controller 16 may be set to one of multiple configurations to interface to the different memory organizations. FIG. 2 illustrates one exemplary memory organization including four individual memory modules 40A, 40B, 40C, and 40D (collectively identified herein as memory modules 40). Memory modules 40 may assume the form of various module configurations such as DIMM, SIMM, RIMM, TRIMM or other defined module configurations. In addition, different types of DIMM modules may be used, such as DIMM configurations having enhanced data output (EDO) DRAMs or DIMM configurations having SDRAMs. Furthermore, the DIMM configurations may be single-sided or double-sided. As illustrated, each memory module 40A-40D includes one or more memory devices 48 which provide the general storage memory accessible by memory controller 16 over a memory control and data bus 50.

Each memory module 40A-40D receives operational voltage, illustrated as memory operating voltage 36, from power converter 28 (FIG. 1) via a socket contact or other interconnecting signal, not shown. The magnitude of memory operating voltage 36 may be altered in accordance with the process of the present invention in order to provide an improved voltage to each of the memory devices 48 of memory modules 40A-40D.

One or more of memory modules 40A-40D further include a nonvolatile memory 52 which is accessible by the low speed bus 22. Nonvolatile memory 52 may be in the form of read only memory (ROM) or may be in the form of a rewritable and randomly accessible memory device. Those of ordinary skill in the art appreciate the various types of nonvolatile memory devices including Programmable ROM (PROM), Electronically Erasable PROM (EEPROM), Flash memory as well as others.

FIG. 3 illustrates an exemplary memory module 40 having an architecture in accordance with a preferred embodiment of the present invention. The memory module 40 includes a memory space 56 which is accessed via a memory control and data bus 50. The memory module 40 includes the electronically readable nonvolatile memory 52, which further includes a memory device voltage configuration 58 in a designated space within nonvolatile memory 52. Nonvolatile memory 52 is accessed via the low speed bus 22, illustrated in FIG. 3 as a serial bus including a data signal 60 and a clock signal 62. Exemplary implementations of low speed bus 22 include I²C or SM bus configurations, whose implementations are readily available or, alternatively, may be obtained from their respective sponsors, namely Phillips Corporation and Intel Corporation.

Figure 4:
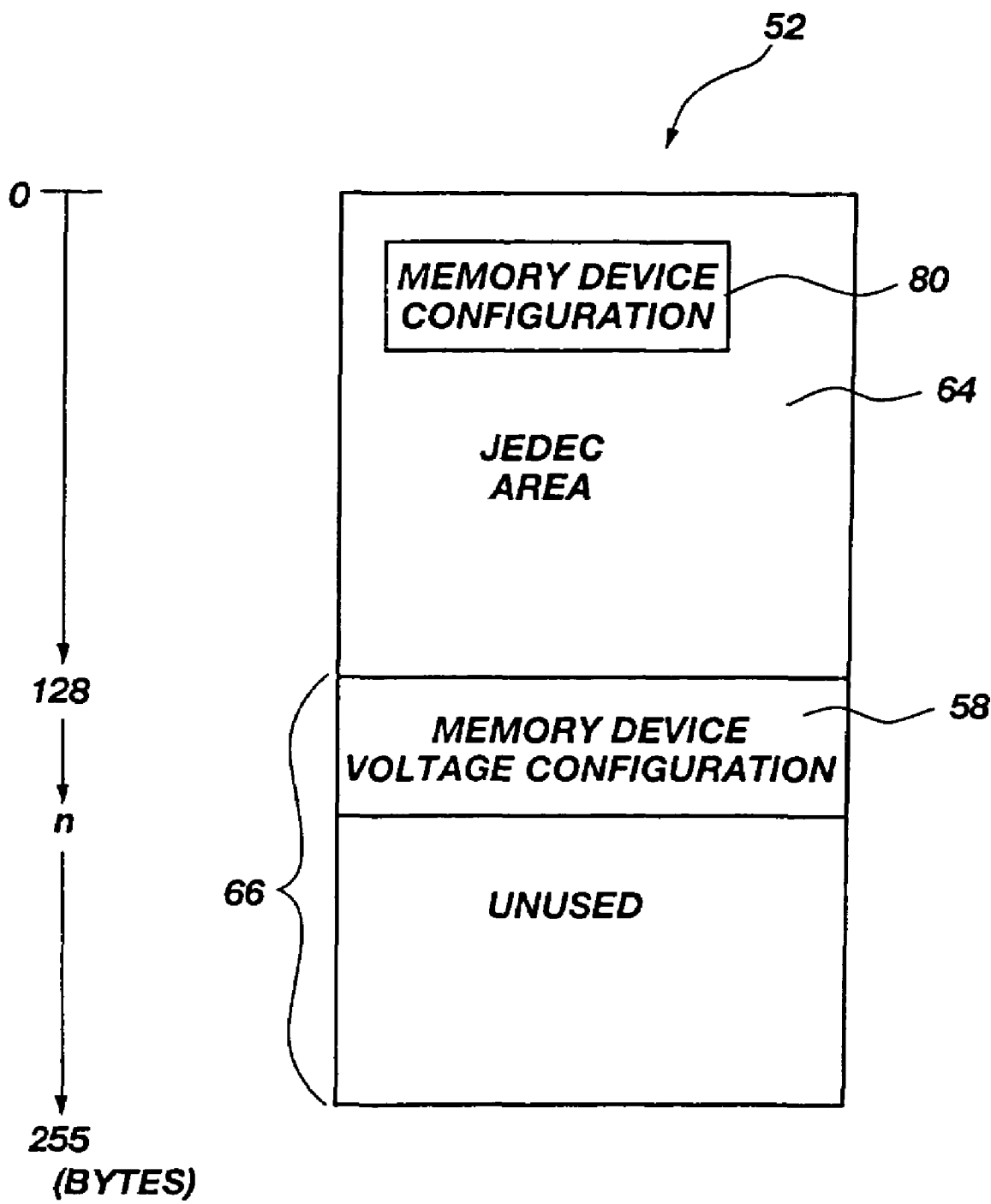
FIG. 4 is a memory map of a nonvolatile memory configured in accordance with an embodiment of the present invention.

FIG. 4 illustrates the address space of nonvolatile memory 52, in accordance with an exemplary embodiment of the present invention. Nonvolatile memory 52 has an address space which is divided into vendor used and unused areas. In the preferred embodiment, nonvolatile memory 52 includes 256 bytes, from byte 0 to byte 255. The first 128 bytes, byte 0 to byte 127, define a first address space 64, which is used by the vendor for storing vendor-supplied information. The first address space 64 is typically organized in accordance with a standard body, such as the Joint Electronic Devices Engineering Counsel (JEDEC) standard. As illustrated in FIG. 4, the first address space 64 may be further referred to as the JEDEC area or memory space and typically includes at least one additional memory device configuration 80 for facilitating interaction between the system memory 20 (FIG. 1) and the processor 12 (FIG. 1) by appropriately configuring the timing or some other interface parameter within memory controller 16 (FIG. 1). Also illustrated in FIG. 4 is a second or undefined address space 66 which is utilized for storing the memory device voltage configuration 58, in accordance with the present invention.

An aspect of the present invention uses the memory device voltage configuration 58 to identify a preferred operating voltage, illustrated as memory operating voltage 36 (FIG. 1), that enables improved or optimal performance by the memory devices 48 (FIG. 3) logically located within memory space 56 (FIG. 3). Through the use of an analysis process programmed within processor 12, a power converter bias 38 (FIG. 1) is calculated from the memory device voltage configuration 58 and the respective commands are sent via the low speed bus 22 to a DAC 30 for the generation of the power converter bias 38.

Figure 5:
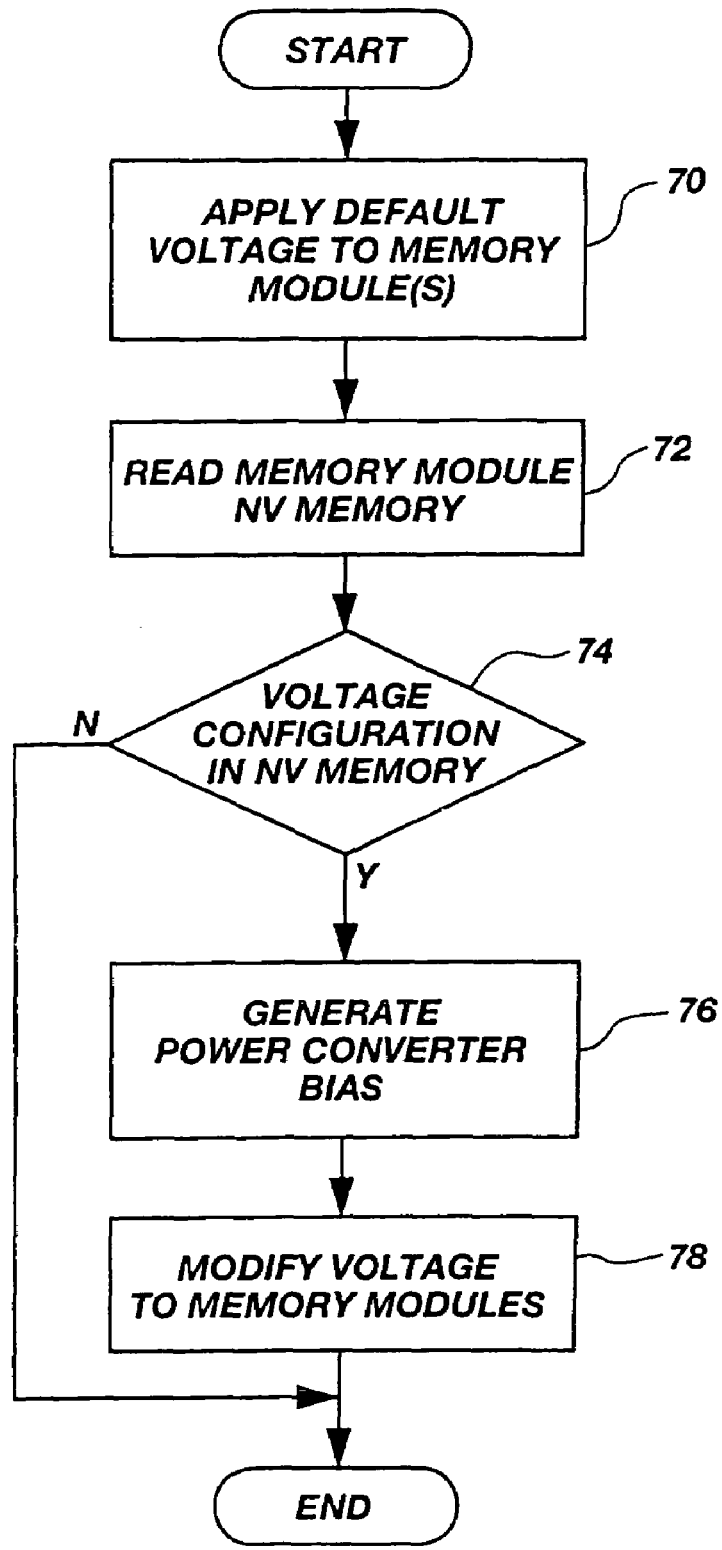
FIG. 5 is a flowchart illustrating voltage modifications to memory devices, in accordance with an embodiment of the present invention.

The method of implementing memory module voltage adjustments is illustrated in FIG. 5 with further reference to the specific elements of FIG. 1. Initially, computer 10 and the individual components, such as processor 12, undergo power-on processes. According to an exemplary embodiment of the present invention, power is applied to the various components of computer 10 with a default voltage configuration 68 in an act 70 providing an initial bias or conditions for directing power converter 28 to generate memory operating voltage 36 to facilitate adequate voltage to the nonvolatile memory during a configuration process. FIG. 1 illustrates one embodiment in which such an application of default voltage may occur. As illustrated in FIG. 1, the default voltage configuration 68 may be applied directly to power converter 28, causing the generation of a default voltage to be present at memory operating voltage 36. Alternatively, a default voltage configuration 68 may be applied, as illustrated in the dashed lines of FIG. 1, to the DAC 30. In such an initialization configuration, system memory 20 allows voltage to be applied to the nonvolatile memory 52 (FIG. 2) in order to enable the reading of the nonvolatile memory 52 in an act 72.

Once the memory module is powered according to the default voltage Configuration 68, an act 72 reads the nonvolatile memory 52 (FIG. 2) and retrieves memory device configuration information. Memory device configuration 80 (FIG. 4) is forwarded to the memory controller 16 for configuring the timing and control for appropriate accessing of the memory device. A query act 74 determines the presence of a memory device voltage configuration 58 (FIG. 4) and, when present, returns the preferred memory device voltage configuration 58 for evaluation by processor 12. A command is generated in a manner capable of altering or otherwise modifying the memory module voltage. In an exemplary embodiment as illustrated in FIG. 1, a power bias is generated in an act 76 and is passed via the low speed bus 22 to the DAC 30. The DAC 30 generates the power converter bias 38 which, in turn, in an act 78 modifies the power parameters of memory operating voltage 36 as sent to the memory modules within system memory 20. Following such adjustments to memory module voltage, the method for modifying the voltage sent to the memory modules concludes and any other initialization steps may be subsequently performed by processor 12.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for testing an operational range of a memory module, comprising:
storing a first memory device voltage configuration within a nonvolatile memory on the memory module, the first memory device voltage configuration identifying a first testing voltage of at least one memory device resident on the memory module;
reading the first memory device voltage configuration from the nonvolatile memory;
generating, in response to the first memory device voltage configuration, a power bias to adjust voltage provided to the at least one memory device of the memory module to the first testing voltage; and
reprogramming the nonvolatile memory with a preferred memory device voltage configuration identifying a preferred operating voltage of the at least one memory device.

2. The method, as recited in claim 1, wherein generating comprises converting the first memory device voltage configuration into a command for generating a power bias and modifying voltage provided to the memory module to the first testing voltage.

3. The method, as recited in claim 1, wherein storing a first memory device voltage configuration further comprises storing the first memory device voltage configuration in an unused portion of a memory space defined according to the Joint Electronic Devices Engineering Counsel (JEDEC) standard.

4. The method, as recited in claim 1, wherein the nonvolatile memory is reprogrammable to store at least the first memory device voltage configuration to test the memory module and a preferred memory device voltage configuration as a result of testing.

5. A method for testing an operational range of a memory module, comprising:
storing a first memory device voltage configuration within a nonvolatile memory on the memory module, the first memory device voltage configuration identifying a first testing voltage of at least one memory device resident on the memory module;
generating, in response to the first memory device voltage configuration, a power bias to adjust voltage provided to the at least one memory device of the memory module to the first testing voltage; and
reprogramming the nonvolatile memory with a preferred memory device voltage configuration identifying a preferred operating voltage of the at least one memory device when the preferred memory device voltage configuration enables preferred performance of the at least one memory device over the first memory device voltage configuration.

* * * * *